United States Patent [19]

Ebara et al.

[11] Patent Number: 4,681,784

[45] Date of Patent: Jul. 21, 1987

[54] LIGHTSAFE MASKING FILM

[75] Inventors: Ryohei Ebara; Shin-ichi Sano, both of Saitama, Japan

[73] Assignee: Somar Corporation, Tokyo, Japan

[21] Appl. No.: 819,661

[22] Filed: Jan. 17, 1986

[30] Foreign Application Priority Data

Jan. 18, 1985 [JP] Japan .................................... 60-5660

[51] Int. Cl.$^4$ ............................ B32B 7/06; B32B 7/12
[52] U.S. Cl. ..................................... 428/40; 428/413; 524/30; 524/32
[58] Field of Search ................... 428/40, 413; 524/32, 524/30

[56] References Cited

U.S. PATENT DOCUMENTS 3,051,670  8/1962  Grantham .......................... 524/32

Primary Examiner—Alexander S. Thomas
Attorney, Agent, or Firm—Sughrue, Mion, Zinn Macpeak & Seas

[57] ABSTRACT

A lightsafe masking film which comprises a substrate of plastic film; a pressure sensitive adhesive layer formed thereon, and a lightsafe peelable layer formed on said adhesive layer, comprising (a) nitrile rubber, (b) nitrocellulose, (c) a tackiness improver, and (d) a lightsafe colorant.

6 Claims, No Drawings

LIGHTSAFE MASKING FILM

FIELD OF THE INVENTION

The present invention relates to a lightsafe masking film to be used as an original copy, after the removal of desired patterns by cutting and peeling, in the photomechanical reproduction process. The lightsafe masking film of this invention can be used in either way, by peeling off, or by resticking for reuse.

BACKGROUND OF THE INVENTION

Heretofore, the lightsafe masking film having a peelable layer has been used in two ways. In one way, the membrane is peeled off, and in the other way, the membrane is reused for resticking. The former method is common. With respect to lightsafe masking film for common use, there have been proposed several products which do not have a sticky surface. For example, Japanese Patent Publication No. 46011/1983 discloses a lightsafe masking film provided with a peelable layer composed of nitrile rubber, nitrocellulose, and lightsafe colorant. However, in the case of this masking film, the membrane loses it adhesion properties once it has been peeled off, and it cannot be used again for resticking.

A lightsafe masking film is known which is capable of reuse for resticking. It is formed of a plastic film, an adhesive layer, a colored resin layer, and a peelable layer formed on top of another, with a pressure sensitive adhesive layer interposed between the two layers mentioned last. (See Japanese Patent Publication No. 9922/1979.) A lightsafe masking film of this type has a disadvantage that the film surface is sticky during work due to the pressure sensitive adhesive layer.

SUMMARY OF THE INVENTION

An object of this invention is to provide a lightsafe masking film which has the surface which is not sticky, and which has the peelable layer which retains its tackiness after peeling. Thus, the lightsafe masking film of this invention is suitable for both common use and resticking.

Thus, this invention is directed to a lightsafe masking film which comprises a substrate of plastic film, a pressure sensitive adhesive layer formed thereon, and a lightsafe peelable layer formed on said adhesive layer, comprising (a) nitrile rubber, (b) nitrocellulose, (c) tackiness improver, and (d) lightsafe colorant.

The tackiness improver is preferably a fatty acid ester, trimellitic acid ester, epoxy compound, or polyester compound.

Although the lightsafe masking film of this invention has an adhesive layer, its surface is not sticky and yet has a proper degree of peel load. Thus it is superior in peeling operation. In addition, the membrane is not damaged or broken when it is peeled off, and the membrane retains tackiness necessary for resticking. For this reason, the lightsafe masking film of this invention can be advantageously used in both cases where the membrane is peeled off and where it is reused with resticking.

DETAILED DESCRIPTION OF THE INVENTION

The substrate of plastic film used in this invention can be made of any material which is commonly used for lightsafe masking film. For example, it can be made of polyethylene terephthalate, polybutylene terephthalate, polyoxybenzoate, or polycarbonate. The film may be unstretched or stretched. The thickness of the film is usually from 25 to 250 $\mu$m.

The pressure sensitive adhesive layer formed on the plastic film substrate is made of a synthetic resin adhesive or rubber adhesive. The former includes, for example, acrylate ester copolymer, saturated polyester compound, and polyurethane, and the latter includes, for example, natural rubber, chloroprene rubber, and nitrile rubber.

The lightsafe peelable layer formed on the pressure sensitive adhesive layer is composed of (a) nitrile rubber, (b) nitrocellulose, (c) tackiness improver, and (d) lightsafe colorant.

(a) The nitrile rubber is, for example, a copolymer of acrylonitrile and other copolymerizable monomer, such as a copolymer of acrylonitrile and butadiene or a terpolymer of acrylontrile, butadiene, and carboxyl group-containing monomer. The nitrile rubber imparts tackiness and peelability to the peelable layer. The nitrile rubber preferably contains from 19 to 51 wt% of acrylonitrile.

(b) The nitrocellulose is compatible with the nitrile rubber and is used together with nitrile rubber to remove stickiness. The nitrocellulose should preferably contain from 10.7 to 12.2 wt% of nitrogen.

(c) The tackiness improver is intended to protect the membrane from breakage and damage when it is peeled off, and yet permits the membrane to be reused for resticking.

The tackiness improver includes fatty acid esters (preferably those having a molecular weight (average) of from 300 to 500), trimellitic acid esters (preferably those having a molecular weight of from 500 to 700), epoxy compounds (preferably those having a molecular weight of from 300 to 1300), and polyester compounds (preferably those having a molecular weight of from 1000 to 8000).

Typical examples of these compounds include dialkyl adipates such as di(butoxyethoxyethyl) adipate, trialkyl trimellitates such as trioctyl trimellitate, epoxidized soybean oil, epoxidized linseed oil, epoxy fatty acid esters such as di(2-ethylhexyl)epoxyhexahydrophthalate, butyl epoxystearate, octyl epoxystearate, and benzyl epoxystearate, and polycarboxylate esters such as polyadipate ester and polysebacate ester. Among them, the most preferable for this invention are fatty acid esters and epoxy compounds such as di(butoxyethoxyethyl)adipate and epoxidized soybean oil, epoxidized linseed oil, butyl epoxystearate, and octyl epoxystearate.

It is possible to use combinations of tackiness improvers. Examples of the preferred combinations are: di(butoxyethoxyethyl)adipate and epoxy compounds. They may be mixed in any ratio so long as the tackiness is improved as desired. Usually the amount of the epoxy compound is about five times that of di(butoxyethoxyethyl)adipate.

(d) The lightsafe colorant can be any lightsafe dye or pigment which is commonly used for lightsafe masking film. Its color tone is not specifically limited.

The above-mentioned four components are used in the following ratios. The ratio of (a) to (b) is generally from 20/80 to 80/20 by weight, and preferably from 30/70 to 70/30 by weight. The quantity of (c) is generally from 0.1 to 30 parts by weight, preferably from 0.5 to 20 parts by weight, per 100 parts by weight of total resin solids in (a) and (b). Component (d) should be as much as necessary to render the film lightsafe. Its quantity is generally from 3 to 30 parts by weight, and preferably from 5 to 20 parts by weight, per 100 parts by weight of total resin solids in (a) and (b).

In addition to the above-mentioned four components (a) to (d), the lightsafe peelable layer may be incorporated with an organic compound such as benzoguanamine resin or an inorganic compound such as silica, both of which are incompatible with the four components. The addition of such compounds prevents the reflection of light and permits the membrane to be used over again after it is peeled off. The quantity of these compounds is generally from 0.1 to 20 parts by weight per 100 parts by weight of total resin solids of (a) and (b).

A portion of the colorant to be added to the lightsafe peelable layer may be added to the pressure sensitive adhesive layer or applied to the upper or lower surface of the peelable layer.

The lightsafe masking film of this invention may be produced, e.g., in the manner described below.

At first, a pressure sensitive adhesive of synthetic resin, natural rubber, synthetic rubber, or semi-synthetic rubber as specified above is applied to the surface of a 25 to 250 μm thick polyethylene terephthalate film, followed by drying. Then a mixture of the following components is applied: (a) nitrile rubber containing from 19 to 51 wt% of acrylonitrile; (b) nitrocellulose in an amount of from 0.25 to 4 times (by weight) that of (a); (c) fatty acid ester, trimellitic acid ester, epoxy compound, or polyester compound in an amount of from 0.1 to 30 parts by weight per 100 parts by weight of total quantity (resin solids) of (a) and (b); and (d) lightsafe colorant sufficient to block light having a wavelength of from 220 to 590 nm. For use, these components are dispersed or dissolved, individually or all together, in an organic solvent.

EXAMPLES 1 TO 23

Pressure sensitive adhesive (ESU-DAINE 150, a registered trademark of Sekisui Chemical Co., Ltd.) was applied to a 75 μm thick polyethylene terephthalate film, followed by drying, whereby the adhesive layer was formed. Onto this layer was applied a coating solution for the lightsafe peelable layer. The coating solution was prepared by dissolving (a) nitrile rubber of acrylonitrile-butadiene copolymer (containing 33 wt% of acrylonitrile), (b) nitrocellulose (H 1/2 as measured according to JIS K6703), (c) tackiness improver, and (d) 28 parts by weight of a 2/1 dye mixture composed of C.I. Solvent Red 84 (red dye) and C.I. Solvent Orange 61 (orange dye), in 800 parts by weight of a 2/1 (by weight) mixed solvent composed of methyl ethyl ketone and toluene. (The amount of each components (a) and (b) is shown in the tables that follow.)

The coating solution was applied to the adhesive layer using a roll coater, followed by drying in an oven for 3 minutes. Thus there was obtained a 110 μm thick lightsafe masking film having a ruby color. On examination with a spectrophotometer, it was found that this film blocks light having a wavelength of from 220 to 590 nm.

All of the films prepared in the examples were not sticky when examined immediately after production and after five days of standing at 50° C. The migration of the dye was not observed. The resulting film was good in peelability, and the peelable film did not tear when peeled off. In addition, the membrane had good dimensional stability and exhibited good tackiness when reused five times for resticking. The peel load of the film was from 10 to 100 g/10 mm, which is adequate for practical use.

TABLE 1 (1)

| Example No. | 1 | 2 | 3 | 4 | 5 | 6 | 7 |
|---|---|---|---|---|---|---|---|
| Component (a) | 40 | 40 | 40 | 40 | 40 | 90 | 90 |
| Component (b) | 160 | 160 | 160 | 160 | 160 | 110 | 110 |
| Component (c1) | 20 | — | — | — | — | 4 | — |
| Component (c2) | — | 60 | — | — | — | — | 50 |
| Component (c3) | — | — | 50 | — | — | — | — |
| Component (c4) | — | — | — | 50 | — | — | — |
| Component (c5) | — | — | — | — | 60 | — | — |

Note 1
Components (a) and (b): As mentioned above.
Component (c1): Di(butoyethoxyethyl) adipate
Component (c2): Trioctyl trimellitate
Component (c3): Epoxidized soybean oil (molecular weight: ca. 1000)
Component (c4): Octyl epoxystearate
Component (c5): Polyester of adipic acid (molecular weight: ca. 3000)
Note 2
Amounts are expressed in parts by weight.

TABLE 1 (2)

| Example No. | 8 | 9 | 10 | 11 | 12 | 13 | 14 | 15 |
|---|---|---|---|---|---|---|---|---|
| Component (a) | 90 | 90 | 90 | 133 | 133 | 133 | 133 | 133 |
| Component (b) | 110 | 110 | 110 | 67 | 67 | 67 | 67 | 67 |
| Component (c1) | — | — | — | 2 | — | — | — | — |
| Component (c2) | — | — | — | — | 30 | — | — | — |
| Component (c3) | 25 | — | — | — | — | 20 | — | — |
| Component (c4) | — | 25 | — | — | — | — | 20 | — |
| Component (c5) | — | — | 30 | — | — | — | — | 10 |

TABLE 1 (3)

| Example No. | 16 | 17 | 18 | 19 | 20 | 21 | 22 | 23 |
|---|---|---|---|---|---|---|---|---|
| Component (a) | 160 | 160 | 160 | 160 | 160 | 90 | 90 | 90 |
| Component (b) | 40 | 40 | 40 | 40 | 40 | 110 | 110 | 110 |
| Component (c1) | 0.2 | — | — | — | — | 2 | 2 | 2 |
| Component (c2) | — | 10 | — | — | — | — | — | — |
| Component (c3) | — | — | 0.2 | — | — | 10 | — | — |
| Component (c4) | — | — | — | 0.2 | — | — | 10 | — |
| Component (c5) | — | — | — | — | 0.2 | — | — | 10 |

COMPARATIVE EXAMPLE 1

(Lightsafe masking film without pressure-sensitive adhesive layer and tackiness improver)

A coating solution was prepared from (a) 133 parts by weight of nitrile rubber of acrylonitrile-butadiene copolymer containing 33 wt% of acrylonitrile, (b) 67 parts by weight of nitrocellulose (H 1/2), (d) 28 parts by weight of a 2/1 (by weight) mixture of C.I. Solvent Red 84 and C.I. Solvent Orange 61, and 800 parts by weight of a 2/1 (by weight) mixed solvent of methyl ethyl ketone and toluene.

The coating solution was applied to the same polyethylene terephthalate film as used in Example 1, followed by drying. Thus there was obtained a lightsafe masking film having a ruby color. This film gave the same light transparency as the one prepared in Example 1, but its membrane was incapable of resticking once it was peeled off.

COMPARATIVE EXAMPLES 2 TO 4

(Lightsafe masking film without the tackiness improver)

Pressure-sensitive adhesive (ESU-DAINE 150, a registered trademark of Sekisui Chemical Co., Ltd.) was applied to the same polyethylene terephthalate film as used in Example 1, whereby the adhesive layer was formed. The coating solution was prepared from (a) nitrile rubber composed of an acrylonitrile-butadiene copolymer containing 33 wt% of acrylo-nitrile, (b) nitrocellulose (H 1/2), (c') butyl adipate, (d) 28 parts by weight of a 2/1 (by weight) mixed dye of C.I. Solvent Red 84 and C.I. Solvent Orange 61, and 800 parts by weight of a 2/1 (by weight) mixed solvent of methyl ethyl ketone and toluene, with the amounts of (a), (b), and (c') varied as shown in Table 2.

The coating solution was applied to the same film as in Example 1, followed by drying. Thus there was obtained a lightsafe masking film having a ruby color. This film gave the same light transparency as that in Example 1. The film in Comparative Example 2 was not sticky but its membrane was liable to tear when it was peeled off. The films in Comparative Examples 3 and 4 were sticky and their membranes were poor in dimensional stability (or they stretched when peeled off). In addition, the membranes were poor in handling due to migration of the dyes.

TABLE 2

| Comparative Example No. | 2 | 3 | 4 |
|---|---|---|---|
| Component (a) | 133 | 133 | 133 |
| Component (b) | 67 | 67 | 67 |
| Component (c') | 0 | 20 | 60 |

EXAMPLES 24 TO 33

The adhesive layer was formed on a 100 μm thick polyethylene terephthalate film in the same manner as in Examples 1 to 23. The coating solution was prepared in the same manner as in Examples 1 to 23, from component (a) with the varied amount of acrylonitrile, component (b) with the varied viscosity, component (c) with varied amount, and component (d) containing C.I. Solvent Orange 61 alone.

The coating solution was applied onto the adhesive layer to provide a 130 μm thick lightsafe masking film having an amber tone. On examination in the same manner as in Examples 1 to 23, it was found that the masking film blocked light having a wavelength of from 220 to 530 nm.

The films thus obtained were as good as those obtained in Examples 1 to 23. They were free of surface tackiness and dye migration, and they were capable of resticking.

TABLE 3 (1)

| Example No. | 24 | 25 | 26 | 27 | 28 |
|---|---|---|---|---|---|
| Component (a): | | | | | |
| AN 19% | — | — | — | — | — |
| AN 33% | 90 | 90 | 90 | 90 | 90 |
| AN 41% | — | — | — | — | — |
| Component (b): | | | | | |
| H ⅛ | 110 | — | — | — | — |
| H ¼ | — | 110 | — | — | — |
| H ½ | — | — | — | — | — |
| H 1 | — | — | 110 | — | — |
| H 20 | — | — | — | 110 | 110 |
| Component (c1) | 4 | — | — | — | — |
| Component (c2) | — | 50 | — | — | — |
| Component (c3) | — | — | 25 | — | — |
| Component (c4) | — | — | — | 25 | — |
| Component (c5) | — | — | — | — | 30 |

Note 1 AN %: Quantity (wt %) of acrylonitrile in component (a).
Note 2 Other components are defined as in Table 1.

TABLE 3 (2)

| Example No. | 29 | 30 | 31 | 32 | 33 |
|---|---|---|---|---|---|
| Component (a): | | | | | |
| AN 19% | 90 | — | — | — | — |
| AN 33% | — | — | 90 | 90 | 90 |
| AN 41% | — | 90 | — | — | — |
| Component (b): | | | | | |
| H ⅛ | — | — | 55 | — | — |
| H ¼ | — | — | — | 55 | — |
| H ½ | 110 | 110 | 55 | 55 | 55 |
| H 1 | — | — | — | — | — |
| H 20 | — | — | — | — | 55 |
| Component (c1) | 4 | — | — | — | — |
| Component (c2) | — | 50 | — | — | — |
| Component (c3) | — | — | 25 | — | — |
| Component (c4) | — | — | — | 25 | — |
| Component (c5) | — | — | — | — | 30 |

EXAMPLE 34

The coating solution prepared in Example 6 was incorporated with granular benzoguanamine resin in an amount of 15 parts by weight per 100 parts by weight of the resin solids. The coating solution was applied to the substrate in the same manner as in Examples 1 to 23. Thus there was obtained a 110 μm thick lightsafe masking film having a ruby color. This film was as good as that in Example 6. The membrane was capable of resticking at least seven times.

EXAMPLE 35

The coating solution prepared in Example 6 was incorporated with hydrated silica powder in an amount of 5 parts by weight for 100 parts by weight of the resin solids. The coating solution was applied to the substrate in the same manner as in Examples 1 to 23. Thus there was obtained a 155 μm thick lightsafe masking film having a ruby color. This film was as good as that in Example 34.

While the invention has been described in detail and with reference to specific embodiments thereof, it will be apparent to one skilled in the art that various changes and modifications can be made therein without departing from the spirit and scope thereof.

What is claimed is:

1. A lightsafe masking film which comprises a substrate of plastic film, a pressure sensitive adhesive layer formed thereon, and a lightsafe peelable layer formed on said adhesive layer, comprising (a) nitrile rubber, (b) nitrocellulose, (c) an epoxy compound as a tackiness improver, and (d) a lightsafe colorant.

2. A lightsafe masking film as in claim 1, wherein said nitrile rubber is a copolymer of acrylonitrile and other copolymerizable monomer, with the content of acrylonitrile being from 19 to 51 wt%.

3. A lightsafe masking film as in claim 1, wherein said nitrocellulose contains from 10.7 to 12.2 wt% of nitrogen.

4. A lightsafe masking film as in claim 1, wherein said epoxy compound is epoxidized soybean oil, epoxidized linseed oil, butyl epoxystearate, octyl epoxystearate, or benzyl epoxystearate.

5. A lightsafe masking film as in claim 1, wherein the ratio of (a) to (b) is from 20/80 to 80/20 by weight, and the quantity of (c) is from 0.1 to 30 parts by weight per 100 parts by weight of total resin solids in (a) and (b).

6. A lightsafe masking film as in claim 1, wherein said lightsafe colorant is used in an amount sufficient to block light having a wavelength of from 220 to 590 nm.

* * * * *